(12) United States Patent
Carlile et al.

(10) Patent No.: US 7,268,600 B2
(45) Date of Patent: Sep. 11, 2007

(54) PHASE- OR FREQUENCY-LOCKED LOOP CIRCUIT HAVING A GLITCH DETECTOR FOR DETECTING TRIGGERING-EDGE-TYPE GLITCHES IN A NOISY SIGNAL

(75) Inventors: Paul S. Carlile, Burlington, VT (US); Barton E. Green, Milton, VT (US); Robert C. Jordan, Hinesburg, VT (US); Anthony J. Perri, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/164,637

(22) Filed: Nov. 30, 2005

(65) Prior Publication Data
US 2007/0120584 A1    May 31, 2007

(51) Int. Cl.
*H03L 7/00* (2006.01)
(52) U.S. Cl. ...................................... 327/156; 327/159
(58) Field of Classification Search ............... None
See application file for complete search history.

(56) References Cited
U.S. PATENT DOCUMENTS

| | | | |
|---|---|---|---|
| 4,009,450 A | 2/1977 | Holcomb et al. | |
| 5,373,254 A * | 12/1994 | Nakauchi et al. | 331/1 A |
| 5,699,020 A | 12/1997 | Jefferson | |
| 6,091,303 A | 7/2000 | Dent | |
| 6,104,251 A | 8/2000 | Ramey et al. | |
| 6,256,362 B1 * | 7/2001 | Goldman | 375/373 |
| 6,356,156 B2 | 3/2002 | Wesolowski | |
| 6,593,817 B1 | 7/2003 | Magazzu et al. | |
| 6,714,464 B2 * | 3/2004 | Bhatia et al. | 365/194 |
| 6,738,922 B1 * | 5/2004 | Warwar et al. | 713/503 |
| 6,756,828 B2 | 6/2004 | Lee et al. | |
| 6,774,731 B2 | 8/2004 | Magazzu et al. | |
| 7,095,259 B2 * | 8/2006 | Knotts | 327/156 |

* cited by examiner

*Primary Examiner*—Kenneth B. Wells
*Assistant Examiner*—An T. Luu
(74) *Attorney, Agent, or Firm*—Downs Rachlin Martin PLLC (57) ABSTRACT

A phase- or frequency-locked loop circuit (200) that generates an accurate output signal (ACC_SYN_OUT) even in the presence of edge-triggering-type glitches (148, 304A, 304B) in the input reference clock signal (REF_CLK). The locked-loop circuit includes a phase or frequency difference detector (216) and a glitch detector (208) that generates a trigger signal (GLITCH_DETECTED) upon detection of at least one glitch. The trigger signal resets the difference detector so as to abort the updating of the output signal that the glitch would otherwise cause.

30 Claims, 5 Drawing Sheets

PHASE- OR FREQUENCY-LOCKED LOOP CIRCUIT HAVING A GLITCH DETECTOR FOR DETECTING TRIGGERING-EDGE-TYPE GLITCHES IN A NOISY SIGNAL

FIELD OF THE INVENTION

The present invention generally relates to the field of integrated circuits. In particular, the present invention is directed to a phase- or frequency-locked loop circuit having a glitch detector for detecting triggering-edge-type glitches in a noisy signal.

BACKGROUND OF THE INVENTION

Many integrated circuits (ICs) require a highly accurate, e.g., less than 1% deviation, frequency source. A conventional design of such a source includes a phase-locked loop (PLL) and a tightly controlled, reference clock. High accuracy requires frequent updating to prevent drift. However, even a single bad update can create an intolerable frequency error. For example, in the context of writing and reading data to and from computer storage disks, the write signal has about a ±1% frequency deviation tolerance. If the frequency of the write signal deviates beyond this tight tolerance, data written after the out-of-tolerance deviation will be corrupted and data may not be successfully read back.

Noise on chipset boards and from sources within ICs themselves creates an environment where the frequency source can be corrupted once every billion or so cycles—in many systems, this equates to many times day. This corruption can cause the input of an on-chip PLL to experience a large phase disturbance, which causes frequency instability. Reducing corruption is becoming more and more challenging as the level of integration continues to increase and signal voltages continue to decrease. For example, radio frequency circuits onboard system-on-chip ICs or chip-set boards exacerbate the noisy environment. In addition, most all ICs/chip-set boards contain multiple clock domains that increase the chance that noise from multiple sources will combine to cause false switching events. Decreasing signal voltage decreases noise margin on both internal and external signals, making the low-voltage signals more susceptible to corruption causing disturbances.

A conventional approach to highly accurate frequency synthesis in the presence of a noisy reference clock is to redesign the integrated circuit/system to limit/eliminate noise sources or interference. Drawbacks to this approach include: difficulties changing the design depending on the time in the product cycle; on-board filtering, if appropriate, can be an expensive solution and take up valuable space; tools for predicting noise are typically inaccurate and pessimistic; the redesign can be very time consuming and debug intensive; and multiple redesigns may be needed before achieving acceptable results. Another conventional approach is to tighten the loop characteristics of the PLL to limit the exposure to noise-induced disturbances. Drawbacks to this approach include the fact that the loop tightening may impact desired loop dynamics and the difficulty of predicting/modeling noise characteristics. Yet another conventional approach to highly accurate frequency synthesis in the presence of a noisy reference clock is to tighten the requirements on the reference clock networks. Drawbacks to this approach include: increased design time; reference clock networks are not as capacitive (noise resistant) as clock networks; filtering schemes may create slow rise time characteristics that can create skew/jitter concerns; and the difficulty of predicting/modeling noise characteristics.

Figure 1A:
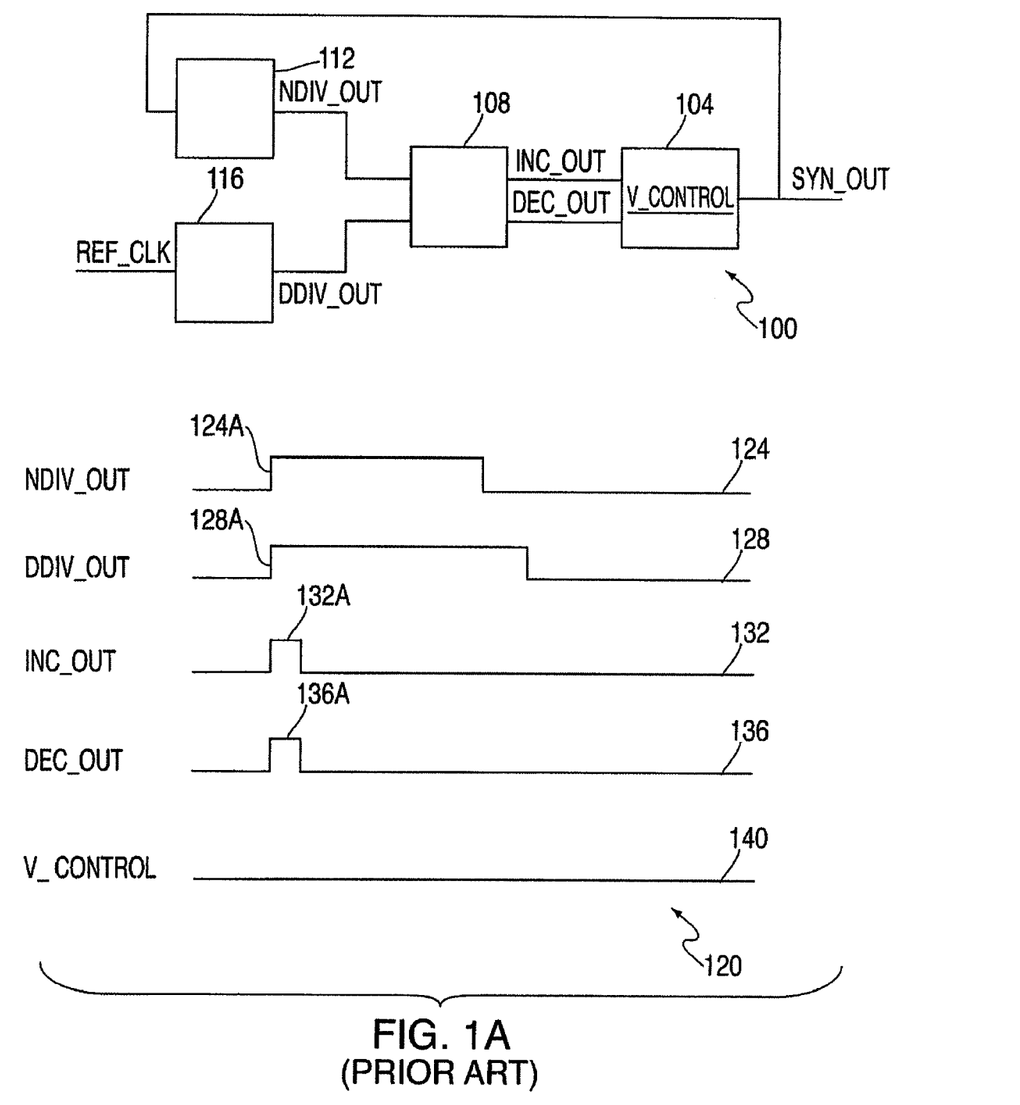
FIG. 1A is a high-level schematic diagram of a conventional PLL frequency synthesizer and a timing diagram for the synthesizer for a clean reference clock input signal.
Figure 1B:
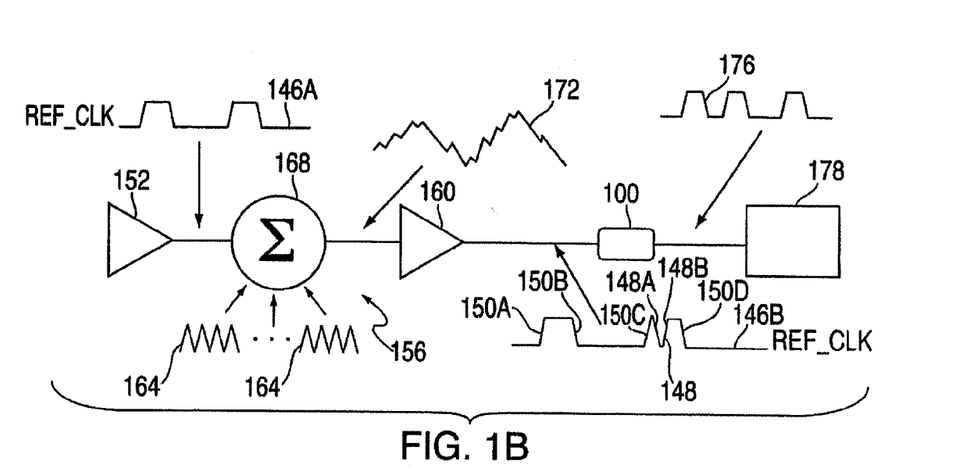
FIG. 1B is a high-level schematic diagram illustrating the effect of a noisy environment on a reference clock signal.
Figure 1C:
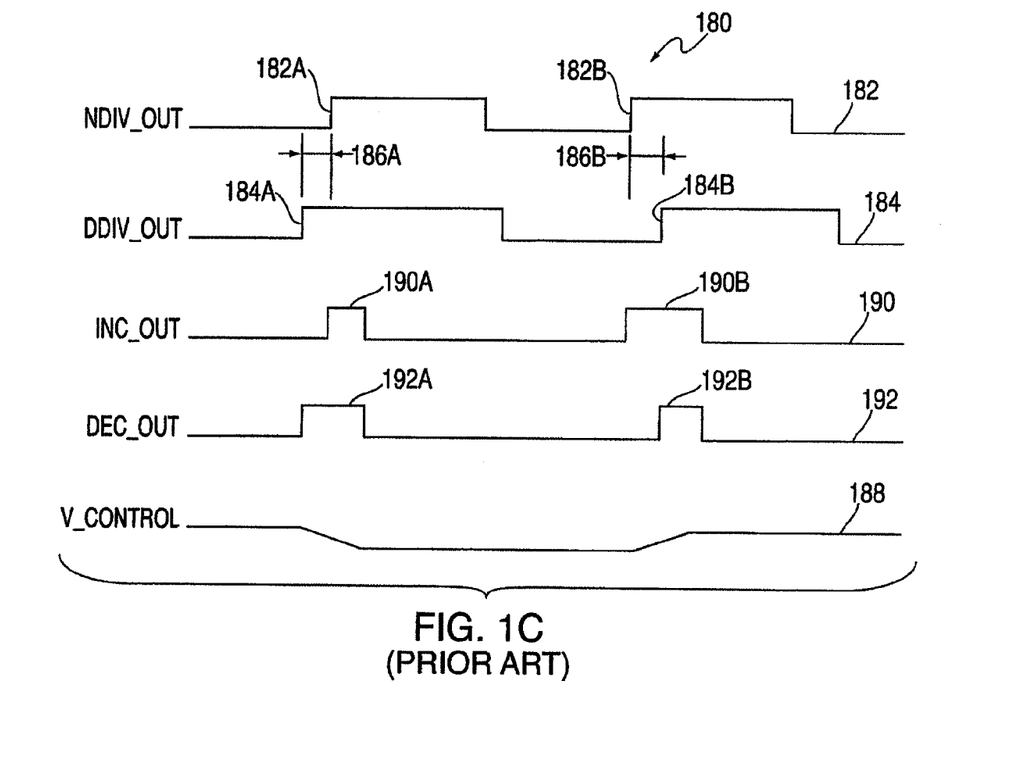
FIG. 1C is a timing diagram for the frequency synthesizer of FIG. 1A for a reference clock input signal containing a glitch.

FIGS. 1A-C illustrate the effect of a noisy reference clock signal REF_CLK on a conventional PLL frequency synthesizer 100 and on the resulting synthesized output signal SYN_OUT. Referring first to FIG. 1A, synthesizer 100 includes a charge pump/loop filter/voltage controlled oscillator (VCO) 104 controlled by a phase detector 108 coupled to a "numerator" frequency divider 112 and a "denominator" frequency divider 116. Charge pump/loop filter/VCO 104 has an internal voltage control signal V_CONTROL that drives the VCO so as to generate SYN_OUT signal. Phase detector 108 controls charge pump/loop filter/VCO 104 via V_CONTROL signal using an increase-voltage signal INC_OUT and a decrease-voltage signal DEC_OUT. Numerator frequency divider 112 divides fed-back SYN_OUT signal by a divide-by value "N" to provide a NDIV_OUT signal, and denominator frequency divider 116 divides REF_CLK signal by a divide-by value "D" to provide a DDIV_OUT signal. Consequently, the frequency of SYN_OUT signal equals the frequency of REF_CLK signal multiplied by N and divided by D.

FIG. 1A includes a timing diagram 120 showing the waveforms 124,128,132, 136,140, respectively, of NDIV_OUT, DDIV_OUT, INC_OUT, DEC_OUT and V_CONTROL signals when the PLL portion of synthesizer 100 is stable, i.e., locked onto a clean REF_CLK signal. Note how the leading edges 124A, 128A of the NDIV_OUT and DDIV_OUT signals, respectively, line up with one another so that the pulses 132A, 136A in INC_OUT and DEC_OUT signals are fully aligned so as to cancel each other, thereby resulting in no change to V_CONTROL signal. Thus, there is no change to the frequency of the SYN_OUT signal.

FIG. 1B illustrates the effect of a noisy environment (e.g., chip board, system on chip, etc.) on an originally clean REF_CLK signal waveform 146A that results in a corrupt REF_CLK signal waveform 146B containing a triggering-edge-type glitch 148, i.e., an anomaly in the waveform having edges 148A-B capable of triggering or otherwise impacting the operation of electronic devices (not shown) in the manner that any of the normal, clean-signal edges 150A-D would affect such devices. For example, an edge-triggered latch that latches on a rising normal edge, such as edges 150A, 150C, would likewise latch on a rising edge of a glitch, e.g., rising edge 148B of glitch 148. It is noted that glitch 148 is denoted a "negative" glitch since it occurs in an otherwise high portion of waveform 146B. Although not shown, a "positive" glitch would be an opposite glitch that occurs in a low portion of waveform 146B.

Clean REF_CLK signal waveform 146A is generated by a reference clock driver 152 and travels through a reference clock network 156 to a reference clock receiver 160. Along its way through network 156, clean REF_CLK signal waveform 146A is subject to electrical noise from various sources 164 that can combine (as represented by summer 168) into a noise signal 172 that can cause receiver 160 to falsely switch and cause glitch 148 in corrupt REF_CLK signal waveform 146B. Corrupt REF_CLK signal waveform 146B would then be the input to frequency synthesizer 100 illustrated more particularly in FIG. 1A, which would, in turn, generate an out-of-specification SYN_OUT signal 176 that could cause various faults in circuitry, such as circuitry 178, that is responsive to the SYN_OUT signal.

FIG. 1C shows a timing diagram 180 for conventional PLL frequency synthesizer 100 of FIG. 1A when REF_CLK signal is corrupted by a glitch, such as glitch 148 of FIG. 1B. As seen, the glitch causes the leading edges 182A-B, 184A-

B, respectively, of waveforms 182, 184 of NDIV_OUT and DDIV_OUT signals to be misaligned so that the signals are out of phase with each other, i.e., have a phase offsets 186A-B. Consequently, a correction to SYN_OUT signal to account for phase offsets 186A-B is made via changes in waveform 188 of V_CONTROL signal due to the mismatched pulses 190A-B, 192A-B of waveforms 190, 192 of INC_OUT and DEC_OUT signals, respectively. Absent the glitch in REF_CLK signal, waveform 188 of V_CONTROL would have been unchanged so that the frequency of SYN_OUT signal would have remained unchanged. However, the glitch has caused frequency synthesizer 100 to change the phase alignment and/or frequency of SYN_OUT signal, potentially to an extent that causes one or more faults in circuitry 178 (FIG. 1B) responsive to the SYN_OUT signal.

SUMMARY OF THE INVENTION

In one aspect, the present invention is directed to a phase- or frequency-locked loop circuit configured to generate a first signal as a function of a second signal. The circuit comprises a controllable oscillator configured to generate the first signal as a function of at least one update signal. A difference detector is configured to generate the at least one update signal as a function of the first signal and the second signal. The difference detector comprises at least one of a phase detector and a frequency detector. A glitch detector is configured to generate a trigger signal in response to at least one glitch in the second signal. The trigger signal is configured to trigger an event that inhibits the at least one update signal from influencing a frequency change in the first signal for a predetermined period of time.

In another aspect, the present invention is directed to method of reducing phase noise or frequency error in a first signal output by a controllable oscillator. The method comprises updating the controllable oscillator as a function of at least one of a phase offset and a frequency offset between the first signal and a second signal. The second signal is monitored so as to detect a glitch in the second signal. When a glitch is detected the updating of the controllable oscillator is aborted for a predetermined period of time.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION OF THE DRAWINGS

Figure 2A:
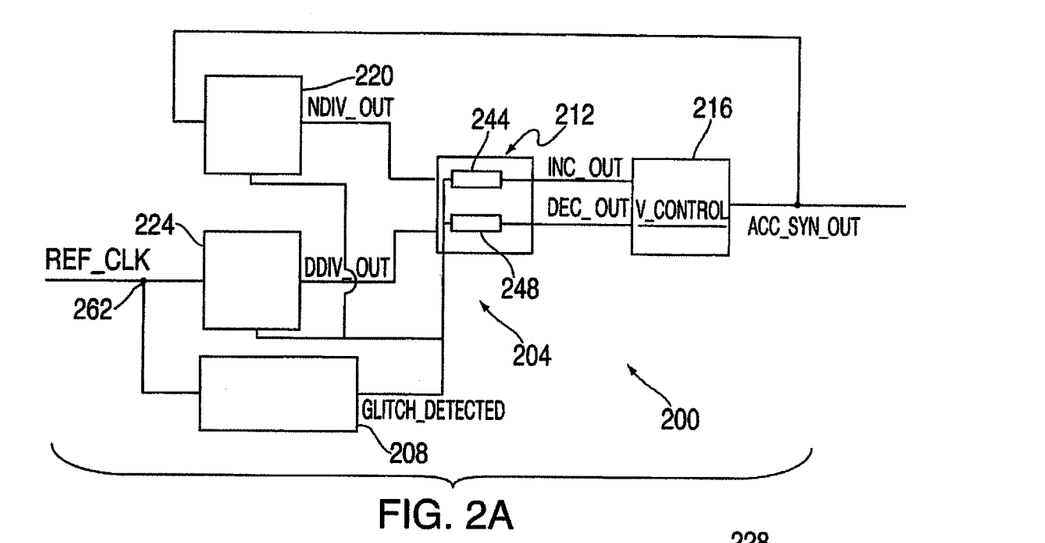
FIG. 2A is a high-level schematic diagram of a PLL circuit of the present invention having a glitch detector for detecting triggering-edge-type glitches in the reference clock input signal.

Referring to FIG. 2A, and also to FIG. 1B, FIG. 2A illustrates a phase-locked loop (PLL) circuit 200 made in accordance with the present invention. In the embodiment shown, PLL circuit 200 is a novel frequency synthesizer capable of synthesizing an output signal ACC_SYN_OUT (standing for "accurate synthesized output") that is highly accurate, even when the reference clock input signal REF_CLK contains one or more triggering-edge-type glitches, such as glitch 148 of FIG. 1B. It is noted here that the terms "glitch," "positive glitch," and "negative glitch" as used herein and the appended claims in referring to a signal or waveform shall have the meaning of the term "triggering-edge-type glitch" described above in the Background section. Those skilled in the art will readily appreciate that although features of the present invention are shown and described relative to PLL circuit 200 being a novel frequency synthesizer, the present invention may be used with other PLL circuits and other circuit types, such as frequency-locked loops (FLLs) and digitally-controlled oscillators (DCOs). Once they understand the various features and benefits of the present invention, those skilled in the art will readily appreciate how to incorporate the present invention into such alternative PLL, FLL and DCO circuits.

PLL circuit 200 generally includes frequency synthesizer circuitry 204 and a glitch detector 208, which is described below in detail. Frequency synthesizer circuitry 204 may be similar to circuitry of conventional PLL frequency synthesizers, such as frequency synthesizer 100 of FIG. 1A. That is, frequency synthesizer circuitry 204 may include a phase detector 212, charge pump/loop filter/voltage controlled oscillator (VCO) 216, and numerator and denominator frequency dividers 220, 224 that correspond to like elements of frequency synthesizer 100 of FIG. 1A. In frequency synthesizer circuitry 204, however, charge pump/loop filter/VCO 216 may generate ACC_SYN_OUT signal as a function of a voltage control signal V_CONTROL that is based on an increase voltage and decrease voltage signals INC_OUT and DEC_OUT generated by phase detector 212. Phase detector 212, of course, detects the phase offset between a first signal NDIV_OUT output by numerator frequency divider 220 and a second signal DDIV_OUT output by denominator frequency divider 224. As discussed below, phase detector 212 may also be configured to be responsive to a signal GLITCH_DETECTED from glitch detector 208 that indicates when at least one glitch has been detected in REF_CLK signal.

As those skilled in the art will readily appreciate, in other embodiments the components of circuit 200 will be different. For example, if the circuit includes an FLL in lieu of the PLL, phase detector 212 would be replaced by a suitable frequency detector that detects the difference in the frequencies of two input signals. In addition, it is noted that although PLL circuit 200 is described as having a VCO in charge pump/loop filter/VCO 216, in other embodiments, VCO may indeed be replaced with another type of controllable oscillator, such as a digitally controlled oscillator, among others. Other changes to circuit 200 resulting from changing the type of locked loop and/or various components within the locked loop will be apparent to those skilled in the art and, thus, need not be described in detail.

In addition, those skilled in the art will understand that while glitch detector 208 is shown and described as monitoring REF_CLK signal for the presence of glitches, one or more glitch detectors of the present invention may monitor other signals for glitches, either alone or in combination with one another and/or with the monitoring of REF_CLK signal. For example, if the input (feedback) signal to numerator frequency divider 220 travels a relatively long path to reach the frequency divider, it may be susceptible to glitches. Likewise, the output signals of one or both frequency dividers 220, 224 may be susceptible to glitches. Consequently, glitch detection methods of the present invention may be applied to these signals. The susceptibility of various signals to glitches will generally vary from circuit to circuit as a function of each circuit's operating characteristics, layout, and operating environment.

As discussed in the Background section above relative to FIGS. 1A-C, a conventional PLL frequency synthesizer, such as frequency synthesizer 100, responds to a glitch in REF_CLK signal by correcting for the phase error caused by the glitch. In the case of frequency synthesizer 100, the glitch causes phase detector 108 to generate non-canceling INC_OUT and DEC_OUT signals so as to adjust SYN_OUT signal to account for the glitch in REF_CLK signal. However, the glitch is an anomaly, and for reasons mentioned in the Background section it is not desirable to adjust the output, i.e., SYN_OUT signal, of frequency synthesizer 100 to account for the anomaly.

Figure 2B:
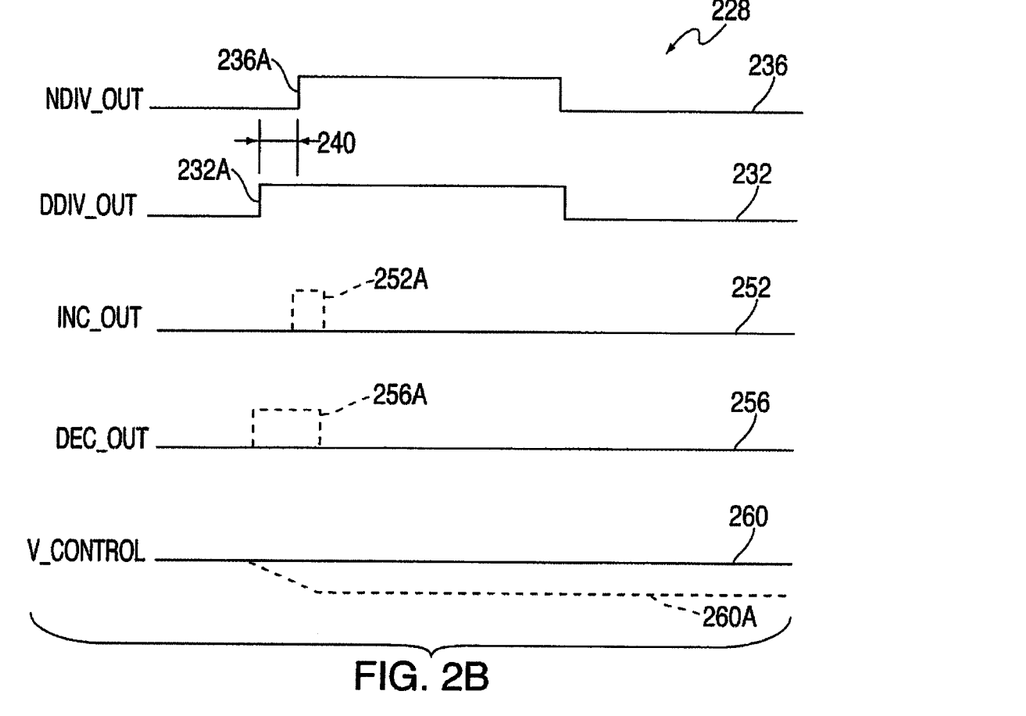
FIG. 2B is a timing diagram for the PLL circuit of FIG. 2A for a reference clock input signal containing a triggering-edge-type glitch.

Referring again to FIG. 2A, and also to FIG. 2B, glitch detector 208 and phase detector 212 are operatively configured so that when the glitch detector detects at least one glitch in REF_CLK signal, it triggers the phase detector to abort sending any signal(s) (in the illustrated embodiment INC_OUT and DEC_OUT signals) to compensate for the phase offset between NDIV_OUT and DDIV_OUT signals caused by the glitch(es). This is illustrated in the timing diagram 228 of FIG. 2B that shows that leading edge 232A of waveform 232 of DDIV_OUT signal is out of phase with leading edge 236A of waveform 236 of NDIV_OUT signal, i.e., has a phase offset 240, due to the presence of a glitch in REF_CLK signal. Glitch detector 208 detects the presence of the glitch and may send a suitable abort update signal, e.g., GLITCH_DETECTED signal, to phase detector 212 that triggers the phase detector to abort signaling charge pump/loop filter/VCO 216 to update ACC_SYN_OUT signal. PLL circuit 200 may also be configured to reset numerator and denominator frequency dividers 220, 224 via GLITCH_DETECTED signal so as to clear any corrupted information and re-initialize the frequency dividers for accurate comparison.

Depending upon the configuration of phase detector 212, GLITCH_DETECTED signal may contain a trigger signal, e.g., a pulse that causes increase-frequency and decrease-frequency gates 244, 248 to reset prior to sending INC_OUT and DEC_OUT signals to charge pump/loop filter/VCO 216. Thus, as shown in FIG. 2B, waveforms 252, 256 of, respectively, INC_OUT and DEC_OUT signals remain low in the presence of a glitch in REF_CLK signal. The result is that the waveform 260 of V_CONTROL signal remains constant and ACC_SYN_OUT does not change. Without glitch detection, phase offset 240 would have caused phase detector 212 to generate pulses 252A, 256A, respectively, on waveforms 252, 256 of INC_OUT and DEC_OUT signals. Pulses 252A and 256A, in turn, would have caused waveform 260 of V_CONTROL signal to decrease, as illustrated by portion 260A of waveform 260) so as to change ACC_SYN_OUT.

It is noted that glitch detector 208 may be connected to a node 262 located upstream of denominator frequency divider 224 so as to monitor REF_CLK signal directly for glitches as shown. In alternative embodiments, glitch detector 212 may be connected elsewhere, such as to the output of denominator frequency divider 224 so as to monitor DDIV_OUT signal for the presence of glitches. Similarly, in alternative embodiments glitch detector 208 may abort updating ACC_SYN_OUT in a manner other than resetting gates 244, 248. For example, GLITCH_DETECTED signal may be input to a triggerable filter (not shown) located between phase detector 212 and charge pump/loop filter/VCO 216 that filters pulses 252A, 256A from waveforms 252, 256 of INC_OUT and DEC_OUT signals prior to reaching the charge pump/loop filter/VCO when triggered by a positive GLITCH_DETECTED signal. Alternatively, a triggerable filter (not shown) may be placed between the charge pump and VCO of charge pump/loop filter/VCO 216 to filter out any change in V_CONTROL signal during a glitch event. Other alternatives are possible and will be recognized by those skilled in the art.

Figure 3A:
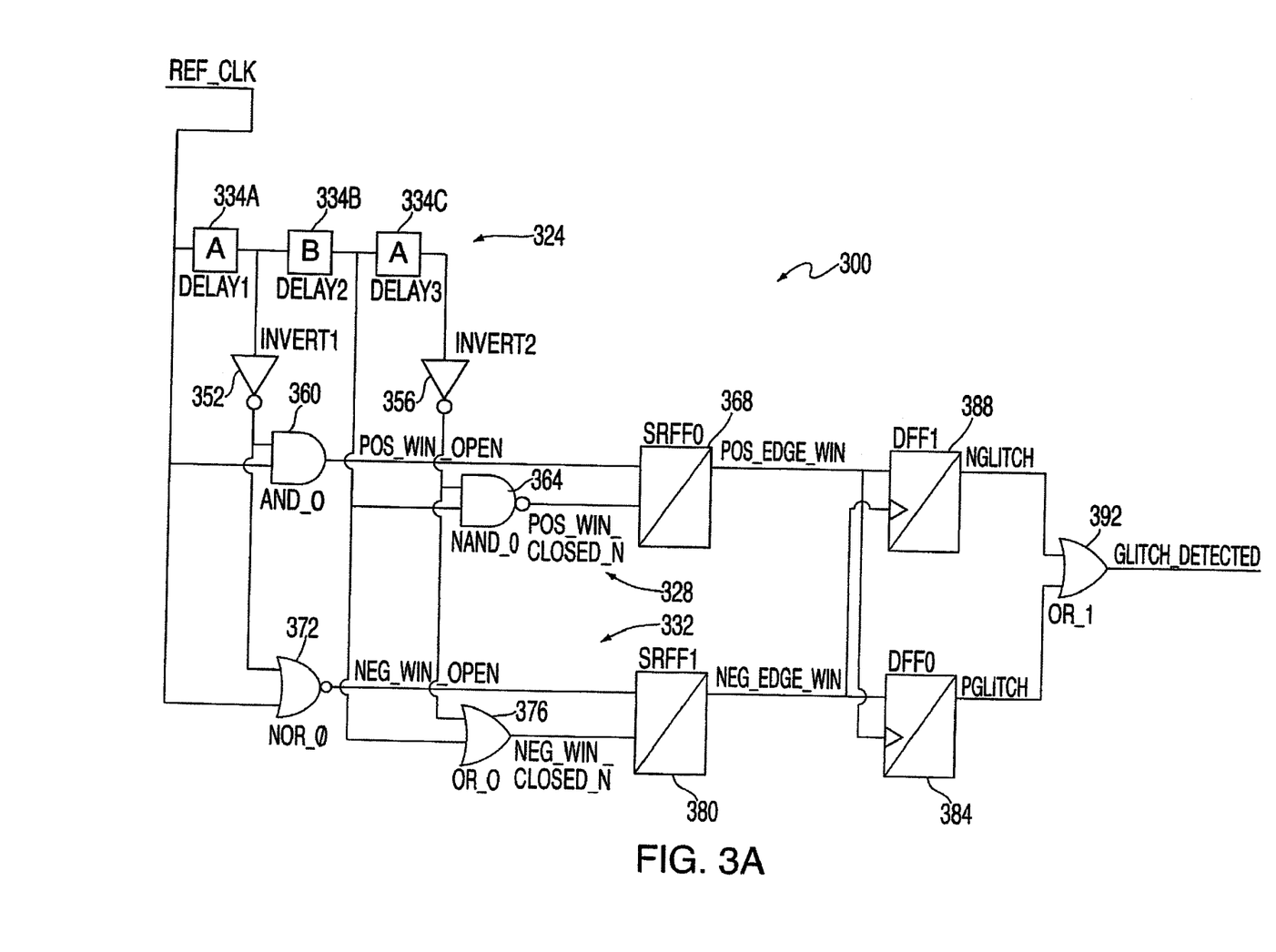
FIG. 3A is a schematic diagram of glitch detection circuitry suitable for use in the glitch detector of FIG. 2A.
Figure 3B:
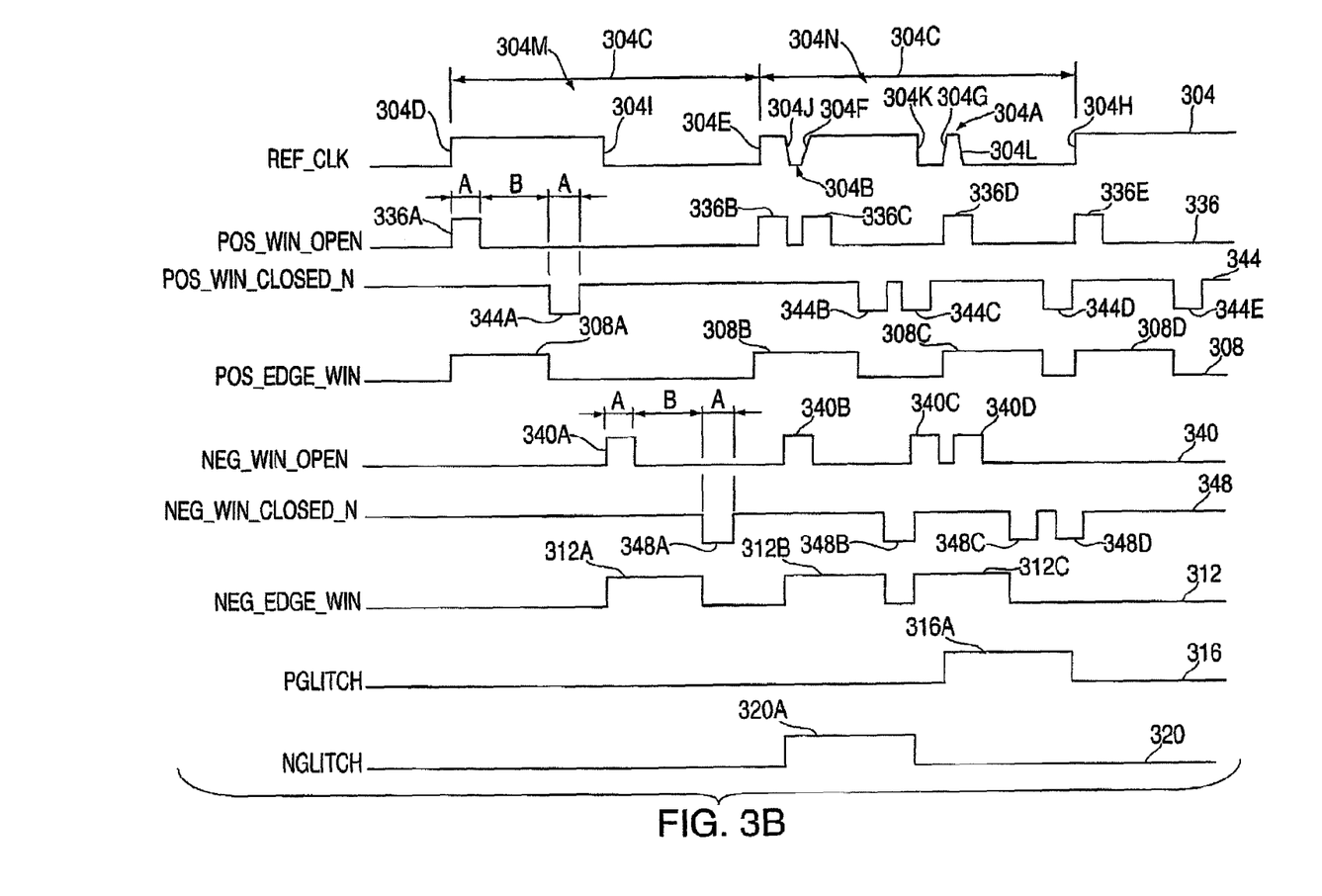
FIG. 3B is a timing diagram illustrating the functioning of the glitch detection circuitry of FIG. 3A with a reference clock signal during a clean cycle and a cycle containing a positive glitch and a negative glitch.

Referring now to FIGS. 3A-B and also to FIG. 2A, FIG. 3A illustrates one embodiment of glitch detection circuitry 300 that may be used in glitch detector 208 (FIG. 2A) to detect the occurrence of either a positive glitch (e.g., positive glitch 304A in waveform 304 of REF_CLK signal) or a negative glitch (e.g., negative glitch 304B in waveform 304), or both. In the illustrated case, waveform 304, being a reference clock signal, has a substantially constant frequency (denoted by cycle period 304C). However, in alternative embodiments, waveform 304 may have a variable frequency. As described below in detail, glitch detection circuitry 300 generally works by opening a positive edge window on each rising edge 304D-H on waveform 304 of REF_CLK signal and a negative edge window on each falling edge 304I-K on waveform 304, unless a corresponding window has already been opened. This is illustrated in FIG. 3B on waveform 308 of a positive edge window signal POS_EDGE_WIN that has four positive edge windows 308A-D corresponding to the five rising edges 304D-H on waveform 304 of REF_CLK signal (note that since window 308B opened on rising edge 304E is already open at rising edge 304F, rising edge 304F does not open a new window) and on waveform 312 of a negative edge window signal NEG_EDGE_WIN that has three negative edge windows 312A-C corresponding to the four falling edges 304I-L on waveform 304 (similar to positive edge window 308B, note that since window 312C opened on falling edge 304K is already open at falling edge 304L, falling edge 304L does not open a new window).

Each window 308A-D, 312A-C may have an open period that is less than one-half of the cycle period so that during a clean cycle of waveform 304 of REF_CLK signal, e.g., clean cycle 304M, the positive edge window of that cycle will not overlap with the negative edge window of that cycle. Since glitches within a glitched cycle of waveform 304, e.g., glitched cycle 304N, cause at least one new window to open (either a positive edge window, negative edge window, or both, depending upon the open period of the windows), glitches can be detected by the presence of overlapping (in time) positive and negative edge windows. As discussed below in detail, overlapping positive and negative windows causes either the waveform 316 of a positive glitch signal PGLITCH to go high so as to create a pulse 316A if the glitch is a positive glitch, such as positive glitch 304A or the waveform 320 of a negative glitch signal NGLITCH to go high so as to create pulse 320A if the glitch is a negative glitch, such as negative glitch 304B. Since it is typically desired to know only whether at least one glitch has occurred and not the type(s), i.e., positive or negative, of the glitch(es), OR gate OR_1 (392) may be used to OR together the PGLITCH and NGLITCH signals to create GLITCH_DETECTED signal of FIG. 2A.

To provide this functionality, glitch detection circuitry 300 may include a delay line 324 that drives positive window circuitry 328 and negative window circuitry 332 that generate, respectively, positive edge windows and negative edge windows, e.g., positive edge windows 308A-D and negative edge windows 312A-D, as discussed above. Delay line 324 may include a plurality of delay elements, e.g., delay elements DELAY1, DELAY2, DELAY3 (334A-C), that define the open period of each window. For example, delay elements DELAY1, DELAY3 (334A, 334C) may define, respectively, the period of window opening pulses, e.g., pulses 336A-E on waveform 336 of a positive window open signal POS_WIN_OPEN and pulses 340A-D on waveform 340 of a negative window open signal NEG_WIN_OPEN, and the period of window closing pulses, e.g., pulses 344A-E on waveform 344 of a positive window close signal POS_WIN_CLOSED_N and pulses 348A-D on waveform 348 of a negative window close signal NEG_WIN_CLOSED_N. The delay of each of delay elements DELAY1, DELAY3 (334A, 334C) may be identical or different. In the present example both delay element DELAY1, DELAY3 (334A, 334C) have a delay of "A," which translates to the duration of each of pulses 336A-E, 340A-D, 344A-E, 348A-D. Delay element DELAY2 (334B) defines the length of time between corresponding window open and window close pulses. In the present example, delay element has a delay of "B," so that the open period of each window is A+B.

As mentioned above, the open period of each window will typically be less than one-half of cycle period 304C so that during a normal, glitch-free cycle the corresponding positive and negative edge windows do not overlap. The open period may be selected to achieve the best results for a particular application. For example, if it is known that glitches are most likely to occur within the first fifth of a cycle period following rising and falling edges, the open period may be selected to be one-quarter of the cycle period. As will be seen below, for the exemplary embodiment of glitch detection circuitry 300, the open period of each window must be less than one-half of cycle period 304C in order to function as designed. Other designs may allow for window open times longer than one-half of cycle period 304C or window openings that are a function of the REF_CLK cycle time.

Positive window circuitry 328 may include various elements that open and close positive windows. For example, window circuitry may include inverters INVERT1, INVERT2 (352, 356), an AND gate AND_0 (360), a NAND gate NAND_0 (364), and a set-reset flip-flop SRFF0 (368) connected as shown. Similarly, negative window circuitry 332 may include various elements that open and close negative windows, such as inverters INVERT1, INVERT2 (352, 356) just mentioned, a NOR gate NOR_0 (372), an OR gate OR_0 (376), and a set-reset flip-flop SRFF1 (380). Circuitry for detecting the presence of a positive glitch may include a data latch (or flip-flop) DFF0 (384), and circuitry for detecting the presence of a negative glitch may include another data latch DFF1 (388). As mentioned above, PGLITCH and NGLITCH signals may be ORed together using an OR gate OR_1 (392) so as to generate GLITCH_DETECTED signal. Further details of the functioning of glitch detection circuitry 300 follow.

A rising edge on waveform 304 of REF_CLK signal, e.g., one of rising edges 304D-H, will initiate a positive pulse on waveform 336 of POS_WIN_OPEN signal, e.g., one of pulses 336A-E corresponding to the rising edge under consideration. The duration of the pulse on waveform 336 signal is directly related to the amount of delay A produced by delay element DELAY1 (334A). AND gate AND_0 (360) creates the pulse on waveform 336 by chopping waveform 304 of REF_CLK signal with an inverted and delayed version of waveform 304 at the output of delay element DELAY1 (334A). The delay (A) of delay element DELAY1 (334A) must be chosen to be large enough to make a pulse that will reliably set the set-reset flip-flop SRFF0 (368). Waveform 304 of REF_CLK signal is further delayed by the delay B through delay element DELAY2 (334B). A negative pulse is created on waveform 344 of POS_WIN_CLOSED_N signal, e.g., one of pulses 344A-E corresponding to the one of pulses 336A-E under consideration, by delaying the output of delay element DELAY2 (334B) by another delay, also A, using delay element DELAY3 (334C) and NANDing the inverted output of the delay element DELAY3 with the output of the delay element DELAY2. The resulting negative pulse drives the active low reset pin on set-reset flip-flop SRFF0 (368).

Set-reset flip-flop SRFF0 (368) is "reset dominant," which means the reset input will always override the set input. Again, the length of the reset pulse is dependent on the amount of delay A generated by delay element DELAY3 (334C) and must be long enough to ensure a reliable reset pulse at set-reset flip-flop SRFF0 (368). The output of set-reset flip-flop SRFF0 (368), i.e., POS_EDGE_WIN signal, creates the window following a rising edge of waveform 304 of REF_CLK signal during which negative glitches will be detected. As mentioned above, the open period of the window will be the sum of delays A and B of delay elements DELAY1, DELAY2 (334A-B). Again, for this particular embodiment of glitch detection circuitry to work as designed, this sum must be less than one-half of cycle period 304C.

A negative edge on waveform 304 of REF_CLK signal, e.g., one of falling edges 304I-L, will initiate positive pulses on waveform 340, and negative pulses on waveform 348 of, respectively, NEG_WIN_OPEN and NEG_WIN_CLOSED_N signals, e.g., ones of pulses 340A-D, 348A-D corresponding to the falling edge under consideration, using concepts similar to the concepts described above for opening and closing a positive window. The elements that produce the pulses, i.e., NOR gate NOR_0 (372) and OR gate OR_0 (376), are OR-based logic functions because a negative edge is being detected. Second set-reset flip-flop SRFF1 (380) receives the pulses on waveforms 340, 348 of NEG_WIN_OPEN and NEG_WIN_CLOSED_N to produce NEG_EDGE_WIN signal, which is the window following a falling edge on waveform 304 of REF_CLK signal during which positive glitches will be detected.

A positive glitch is detected when a positive edge on waveform 304 of REF_CLK is detected as indicated by POS_EDGE_WIN signal going high while NEG_EDGE_WIN is also active high. This is accomplished using rising-edge-triggered data flip-flop DFF0 (384), wherein NEG_EDGE_WIN signal drives the data input and POS_EDGE_WIN signal clocks the flip-flop. A negative glitch is detected by the opposite combination of events. The data input of data flip-flop DFF1 (388) is fed by POS_EDGE_WIN signal while the NEG_EDGE_WIN signal clocks the flip-flop on rising edges. Thus, if a negative edge is detected during a positive edge window, then a negative glitch is detected.

Although the invention has been described and illustrated with respect to an exemplary embodiment thereof, it should be understood by those skilled in the art that the foregoing and various other changes, omissions and additions may be made therein and thereto, without parting from the spirit and scope of the present invention.

What is claimed is:

1. A phase- or frequency-locked loop circuit configured to generate a first signal as a function of a second signal, comprising:
    (a) a controllable oscillator configured to generate the first signal as a function of at least one update signal;
    (b) a difference detector configured to generate said at least one update signal as a function of the first signal and the second signal, said difference detector comprising at least one of a phase detector and a frequency detector; and
    (c) a glitch detector configured to generate a trigger signal in response to at least one glitch in said second signal, said trigger signal configured to trigger an event that inhibits said at least one update signal from influencing a frequency change in the first signal for a predetermined period of time.

2. A phase- or frequency-locked loop circuit according to claim 1, wherein the second signal is a digital signal having a plurality of rising edges and a plurality of falling edges alternating with the plurality of rising edges, said glitch detector comprising at least one time window generator for generating time windows as a function of said plurality of rising edges and said plurality of falling edges.

3. A phase- or frequency-locked loop circuit according to claim 2, wherein said at least one time window generator includes a delay line operatively configured to open and close each of said time windows.

4. A phase- or frequency-locked loop circuit according to claim 2, wherein the second signal has a substantially fixed cycle time and said at least one time window generator is configured so that each of said time windows is open for a period less than one-half of said substantially fixed cycle time.

5. A phase- or frequency-locked loop circuit according to claims 2, wherein said glitch detector further comprises a window overlap detector configured to detect when more than one of said time windows is open at any point in time.

6. A phase- or frequency-locked loop circuit according to claim 2, wherein said glitch detector comprises a rising edge time window generator and a falling edge time window generator.

7. A phase- or frequency-locked loop circuit according to claim 6, wherein the second signal has a substantially fixed cycle time and each of said rising edge time window generator and said falling edge time window generator is configured to generate corresponding respective rising edge and falling edge time windows each having an open time less than one-half of the substantially fixed cycle time of the second signal.

8. A phase- or frequency-locked loop circuit according to claim 7, wherein said glitch detector further comprises a window overlap detector configured to detect when one of said rising edge time windows and one of said falling edge time windows are both open at any point in time.

9. A phase- or frequency-locked loop circuit according to claim 1, further comprising a numerator frequency divider and a denominator frequency divider and said trigger signal resets each of said numerator and denominator frequency dividers.

10. A phase- or frequency-locked loop circuit according to claim 1, further comprising a loop for feeding the first signal back to said difference detector, said loop including a first frequency divider configured to modify the first signal prior to the first signal reaching said difference detector.

11. A phase- or frequency-locked loop circuit according to claim 10, wherein the second signal is input into said difference detector, the phase locked loop circuit further comprising a second frequency divider for modifying the second signal prior to the second signal reaching said difference detector.

12. A phase- or frequency-locked loop circuit according to claim 11, wherein said glitch detector is coupled between a point upstream of said second frequency divider and said difference detector.

13. An integrated circuit chip, comprising:
    (a) circuitry configured to receive a first signal; and
    (b) a phase- or frequency-locked loop circuit configured to generate said first signal as a function of a second signal, said phase- or frequency-locked loop circuit including:
        (i) a controllable oscillator configured to generate said first signal as a function of at least one update signal;
        (ii) a difference detector configured to generate said at least one update signal as a function of said first signal and said second signal, said difference detector comprising at least one of a phase detector and a frequency detector; and
        (iii) a glitch detector configured to generate a trigger signal in response to at least one glitch in said second signal, said trigger signal configured to trigger an event that inhibits said at least one update signal from influencing a frequency change in the first signal for a predetermined period of time.

14. An integrated circuit chip according to claim 13, wherein the second signal is a digital signal having a plurality of rising edges and a plurality of falling edges alternating with the plurality of rising edges, said glitch detector comprising at least one time window generator for generating time windows as a function of said plurality of rising edges and said plurality of falling edges.

15. An integrated circuit chip according to claim 14, wherein said at least one time window generator includes a delay line operatively configured to open and close each of said time windows.

16. An integrated circuit chip according to claim 14, wherein the second signal has a substantially fixed cycle time and said at least one time window generator is configured so that each of said time windows is open for a period less than one-half of said substantially fixed cycle time.

17. An integrated circuit chip according to claims 14, wherein said glitch detector further comprises a window overlap detector configured to detect when more than one of said time windows is open at any point in time.

18. An integrated circuit chip according to claim 14, wherein said glitch detector comprises a rising edge time window generator and a falling edge time window generator.

19. An integrated circuit chip according to claim 18, wherein the second signal has a substantially fixed cycle time and each of said rising edge time window generator and said falling edge time window generator is configured to generate corresponding respective rising edge and falling edge time windows each having an open time less than one-half of the substantially fixed cycle time of the second signal.

20. An integrated circuit chip according to claim 19, wherein said glitch detector further comprises a window overlap detector configured to detect when one of said rising edge time windows and one of said falling edge time windows are both open at any point in time.

21. An integrated circuit chip according to claim 13, wherein said phase- or frequency-locked loop further comprises a numerator frequency divider and a denominator frequency divider and said trigger signal resets each of said numerator and denominator frequency dividers.

22. An integrated circuit chip according to claim 13, further comprising a loop for feeding the first signal back to said difference detector, said loop including a first frequency divider configured modify the first signal prior to the first signal reaching said difference detector.

23. An integrated circuit chip according to claim 22, wherein the second signal is input into said phase detector, the phase locked loop circuit further comprising a second frequency divider for modifying the second signal prior to the second signal reaching said difference detector.

24. An integrated circuit chip according to claim 23, wherein said glitch detector is coupled between a point upstream of said second frequency divider and said difference detector.

25. An integrated circuit chip according to claim 13, further comprising a clock network in communication with said difference detector.

26. A method of reducing phase noise or frequency error in a first signal output by a controllable oscillator, the method comprising:

(a) updating the controllable oscillator as a function of at least on of a phase offset and a frequency offset between said first signal and a second signal;

(b) monitoring said second signal so as to detect a glitch in said second signal; and (c) when a glitch is detected in step (b), aborting step (a) for a predetermined period of time.

27. A method according to claim 26, wherein said second signal is a digital signal having a plurality of rising edges and a plurality of falling edges and step (b) including monitoring said digital signal so as to detect an edge glitch in said digital signal.

28. A method according to claim 27, wherein step (b) includes opening a positive edge window for each of said plurality of rising edges and opening a negative edge window for each of said plurality of falling edges.

29. A method according to claim 28, wherein said second signal has a substantially fixed cycle time and step (b) includes opening each of said positive edge and negative edge windows for a period less than one-half said substantially fixed cycle time.

30. A method according to claim 9, wherein step (b) includes detecting a glitch by determining if one of said positive edge windows and one of said positive edge windows are both open at any point in time.

* * * * *